(12) United States Patent  
Takesako et al.

(10) Patent No.: US 8,614,146 B2  
(45) Date of Patent: Dec. 24, 2013

(54) SEMICONDUCTOR DEVICE MANUFACTURE METHOD AND SEMICONDUCTOR DEVICE

(75) Inventors: Satoshi Takesako, Yokohama (JP); Naoki Idani, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 102 days.

(21) Appl. No.: 13/025,776

(22) Filed: Feb. 11, 2011

(65) Prior Publication Data

US 2012/0001344 A1 Jan. 5, 2012

(30) Foreign Application Priority Data

Jun. 30, 2010 (JP) .................................. 2010-149354

(51) Int. Cl.
*H01L 21/768* (2006.01)

(52) U.S. Cl.
USPC .................................. 438/672; 257/E21.582

(58) Field of Classification Search
None
See application file for complete search history.

(56) References Cited

U.S. PATENT DOCUMENTS

2006/0163730 A1* 7/2006 Matsumoto et al. .......... 257/751

FOREIGN PATENT DOCUMENTS

JP 2006-156519 A 6/2006

* cited by examiner

*Primary Examiner* — Seahvosh Nikmanesh
(74) *Attorney, Agent, or Firm* — Fujitsu Patent Center

(57) ABSTRACT

A semiconductor device manufacture method includes: forming an insulating film above a semiconductor substrate; etching the insulating film to form a dummy groove having a first depth, a wiring groove having a second depth deeper than the first depth, and a via hole to be disposed on a bottom of the wiring groove; depositing a conductive material in the dummy groove, wiring groove and via hole and above the insulating film; and polishing and removing the conductive material above the insulating film.

17 Claims, 11 Drawing Sheets

SEMICONDUCTOR DEVICE MANUFACTURE METHOD AND SEMICONDUCTOR DEVICE

CROSS-REFERENCE TO RELATED APPLICATION

This application is based upon and claims the benefit of priority of the prior Japanese Patent Application JP2010-149354, filed on Jun. 30, 2010, the entire contents of which are incorporated herein by reference.

FIELD

The embodiments discussed herein are related to a semiconductor device manufacture method and a semiconductor device.

BACKGROUND

In order to obtain low resistance fine wirings, wirings are formed by a damascene method by using copper (Cu) or copper alloy as wiring material. According to a general damascene method, a barrier metal film is formed on an interlayer insulating film, covering a wiring trench formed in the interlayer insulating film, a seed film is formed on the barrier metal film, and a Cu film for example is formed by a plating method on the seed film. Unnecessary portions of the Cu film and barrier metal film on the interlayer insulating film are removed by chemical mechanical polishing (CMP) to leave wirings in the wiring trenches.

If a conductive layer such as a barrier metal film is left on the interlayer insulating film after polishing, this conductive layer may cause leak between wirings. In order to prevent the conductive layer from being left on the interlayer insulating film, an upper portion of the interlayer insulating film is cut to some depth during CMP for the conductive layer to perform so-called over polishing.

An interlayer insulating film using low dielectric material having a dielectric constant of, e.g., 3.0 or lower has been proposed recently in order to reduce a parasitic capacitance (e.g., refer to Japanese Patent Laid-open Publication No. 2006-156519). The low dielectric constant film of this type contains methyl groups ($CH_x$) and the like and is hydrophobic. Therefore, the surface of the low dielectric constant film have a tendency to repel CMP polishing slurry, and polishing is hard to progress.

An interlayer insulating film having the structure that a hydrophilic cap film made of, e.g., silicon oxide ($SiO_2$) is formed on a hydrophobic low dielectric constant film has therefore been proposed. The cap film is over-polished. The low dielectric constant film has low tight adhesion to the underlying insulating film, and is likely to have film stripping. Polishing is stopped by leaving the cap film to some thickness from the viewpoint of preventing film stripping.

However, since silicon oxide ($SiO_2$) has a dielectric constant of over 3.0, if this film is left on the low dielectric constant film, parasitic capacitance between wirings becomes high. In order to avoid high parasitic capacitance, techniques of directly polishing a hydrophobic low dielectric constant film without using a cap film have been developed.

In polishing an interlayer insulating film using a hydrophobic low dielectric constant film, polishing slurry has high wettability in an area where wirings are disposed densely, whereas polishing slurry has low wettability in an area where wirings are disposed coarsely. In the area where wirings are disposed coarsely, dishing and erosion are likely to occur. Dishing and erosion do not occur only when an interlayer insulating film using a hydrophobic low dielectric constant film is polished, but dishing and erosion may occur when a polishing target having a plurality of different materials such as an insulating film having a buried conductive Cu film is polished.

Techniques of providing a uniform wiring density in a wafer plane by disposing dummy wirings between wirings have been proposed to suppress dishing and erosion. Parasitic capacitance is, however, formed between dummy wirings and wirings, and a wiring delay occurs.

SUMMARY

According to one aspect of the present invention, a semiconductor device manufacture method includes: forming an insulating film above a semiconductor substrate; etching the insulating film to form a dummy groove having a first depth, a wiring groove having a second depth deeper than the first depth, and a via hole to be disposed on a bottom of the wiring groove; depositing a conductive material in the dummy groove, wiring groove and via hole and above the insulating film; and polishing and removing the conductive material above the insulating film.

According to another aspect of the present invention, a semiconductor device manufacture method includes: forming an insulating film above a semiconductor substrate; forming a dummy groove having a first depth in the insulating film; burying a burying material in the dummy groove; forming a wiring groove having a second depth deeper than the first depth; removing the burying material from the dummy groove; depositing a conductive material in the dummy groove, wiring groove and above the insulating film; and polishing and removing the conductive material above the insulating film.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Description will be made first on a wiring forming method by a single damascene method according to the first embodiment. FIGS. 1A to 1K are schematic cross sectional views illustrating main processes of a wiring forming method according to the first embodiment.

Figure 1A:
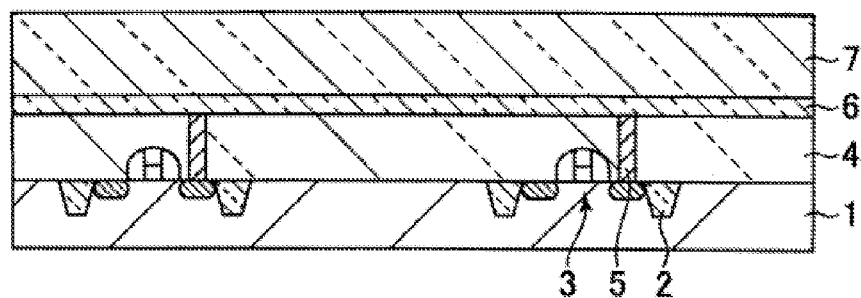
FIGS. 1A to 1K are schematic cross sectional views illustrating main processes of a wiring forming method according to a first embodiment.

Reference is made to FIG. 1A. An element separation insulating film 2 is formed in a semiconductor substrate, e.g., a silicon substrate by shallow trench isolation (STI) to define active regions. A MOS transistor 3 is formed in the active region.

For example, silicon oxide (SiO$_2$) is deposited on the semiconductor substrate 1 to a thickness of 300 nm to 1000 nm by chemical vapor deposition (CVD) to form an interlayer insulating film 4 covering the MOS transistor 3. Contact holes for connection of the source/drain regions of the MOS transistor 3 are formed through the interlayer insulating film 4 by photolithography and etching. Tungsten (W) is buried in the contact holes through, e.g., titanium nitride (TiN) layer to form a contact plug 5.

For example, silicon carbide (SiC) is deposited on the interlayer insulating film 4 to a thickness of 10 nm to 200 nm by CVD to form an etching stopper insulating film 6. In addition to silicon carbide, silicon carbonitride (SiCN), silicon nitride (SiN) and the like may be used for the etching stopper film 6. The etching stopper film 6 may have a lamination structure combining a silicon carbide film, a silicon carbonitride film, and a silicon nitride film with a silicon oxide film, a silicon carbooxide film (SiOC) or the like.

An interlayer insulating film 7 is formed on the etching stopper insulating film 6. A thickness of the interlayer insulating film 7 is, e.g., 100 nm to 1000 nm. This thickness is a thickness necessary for the interlayer insulating film added to a thickness to be removed by a later polishing process.

The interlayer insulating film 7 is a low dielectric constant insulating film having a dielectric constant of, e.g., 3.0 or lower and containing, e.g., an organic material. The interlayer insulating film 7 is formed by one of, or a combination of CVD, plasma enhanced CVD (PE-CVD) and spin coating by using a material selected from a group consisting of organic silane having methyl group and organic siloxane having methyl group.

The material for the interlayer insulating film 7 may be, e.g., one of, or a combination of methyl silane, dimethyl silane, trimethyl silane, tetramethyl silane, phenyl silane, methyl phenyl silane, cyclohexyl silane, ethyl silane, diethyl silane, tetraethoxy silane, dimethyldiethoxy silane, dimethyldimethoxy silane, dimethylethoxy silane, methyldiethoxy silane, triethoxy silane, trimethyl phenoxy silane, phenoxy silane, diethoxy silane, diacethoxy methyl silane, methyltriethoxy silane, di-tert-butyl silane, tert-butyl silane, di-tert-butyl silane, 1,3,5,7-tetramethyl cyclotetra siloxane, octamethyl cyclotetra siloxane, hexamethyl cyclotri siloxane, hexamethyl disiloxane, 1,1,2,2-tetramethyldisiloxane, and octamethyl trirsiloxane. The interlayer insulating film 7 made of the above-described material contains methyl group and is hydrophobic. Porogen may be contained in the interlayer insulating film 7 in order to lower a dielectric constant.

The other materials suitable for the spin coating method may be LKD (product name) of JSR Company, porous SiLK (product name) of The Dow Chemical Company, scalable porous silica of ULVAC Company or Mitsui Chemicals and the like. The materials suitable for CVD may be Black Diamond (product name) of AMAT Company, Aurora (product name) of ASM Company, CORAL (product name) of Novellus and the like.

Figure 1B:
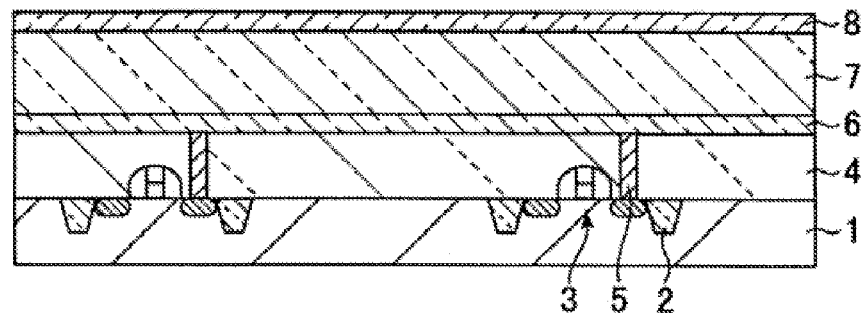

Reference is made to FIG. 1B. For example, silicon oxide is deposited on the interlayer insulating film 7 to a thickness of 10 nm to 150 nm by physical vapor deposition (PVD) to form a hard mask film 8. In addition to silicon oxide, an insulating film of silicon carbide, silicon carbooxide, silicon carbonitride, silicon nitride or the like may be used as the hard mask film 8. A metal film may also be used as the hard mask film 8. The hard mask film 8 may be a lamination film of two or more films selected from a group consisting of a silicon oxide film, a silicon carbide film, a silicon carbooxide film, a silicon carbonitride film, a silicon nitride film, and a metal film.

Considering workability of an etching process and a chemical mechanical polishing (CMP) process to be described later, it is desired to form the hard mask film 8 of silicon oxide (SiO$_2$). The hard mask film 8 is not essential for the present invention, and it may be omitted.

Figure 1C:
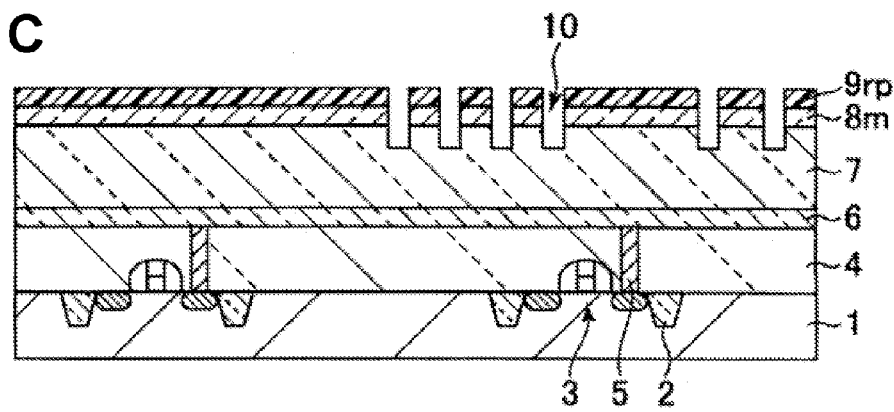

Reference is made to FIG. 1C. Photoresist is coated on the hard mask film 8, exposed and developed to form a resist pattern 9rp having openings of the shape corresponding to grooves 10 (hereinafter called dummy grooves 10) in which dummy wirings are formed.

By using the resist pattern 9rp as a mask, the hard mask film 8 is etched by reactive ion etching (RIE) to form a hard mask 8m. Etching gas for the hard mask 8 may be, e.g., CF$_4$.

By using the resist pattern 9rp and hard mask 8m as a mask, the interlayer insulating film 7 is etched by RIE to form dummy grooves 10 in the interlayer insulating film 7. Etching gas for the interlayer insulating film 7 may be, e.g., CF$_4$. A depth of the dummy groove 10 is desired to be shallower by 0 nm to 30 nm than a film thickness to be removed by a polishing process to be described later.

Figure 1D:
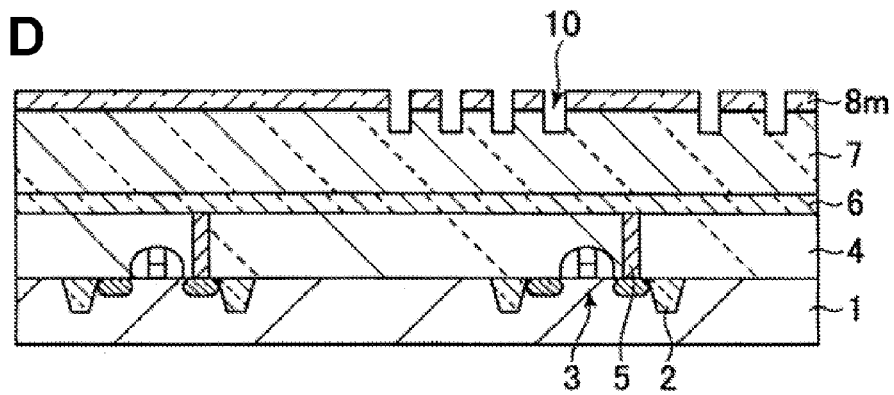

Reference is made to FIG. 1D. After the dummy grooves 10 are formed, the resist pattern 9rp is removed by ashing.

Figure 1E:
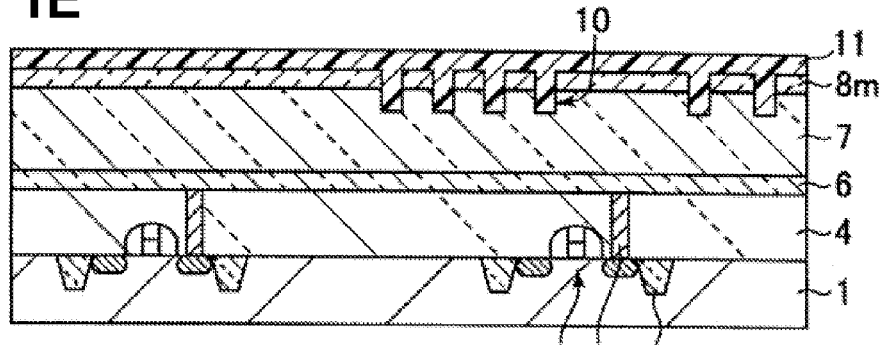

Reference is made to FIG. 1E. Photoresist is coated on the hard mask 8m to form a resist film 11. The resist film 11 buries the dummy grooves 10.

Figure 1F:
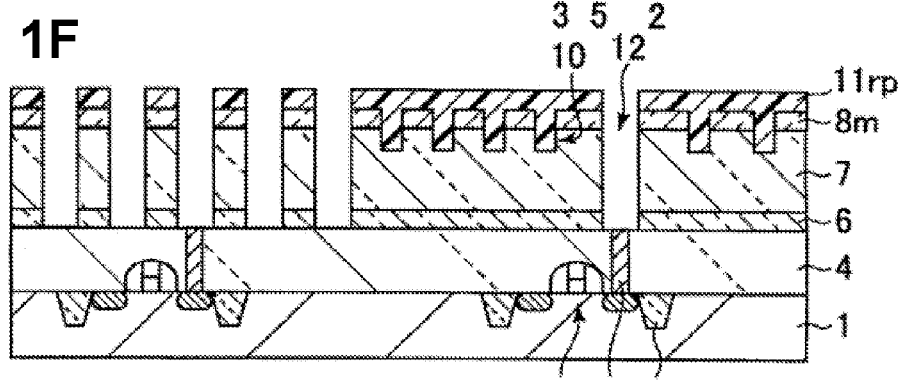

Reference is made to FIG. 1F. The resist film 11 is exposed and developed to form a resist pattern 11rp having openings of the shape corresponding to wiring grooves (trenches) 12 in which wirings are formed. By using the resist pattern 11rp as a mask, the hard mask 8m is etched by RIE to form openings of the shape corresponding to the wiring grooves 12. By using the resist pattern 11rp and hard mask 8m as a mask, the interlayer insulating film 7 is etched by RIE to form openings of the shape corresponding to the wiring grooves 12. Next, by changing the etching gas to a mixture gas of CF$_4$ and O$_2$, the etching stopper insulating film 6 is etched to expose the contact plugs 5.

Figure 1G:
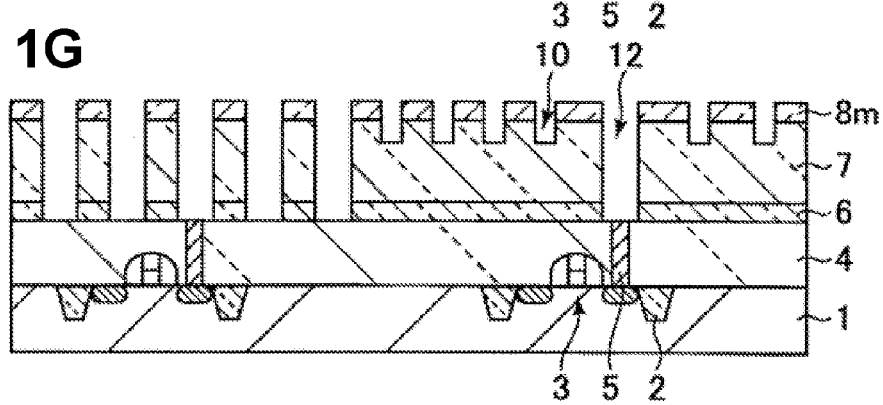

Reference is made to FIG. 1G. The resist pattern 11rp burying in the dummy grooves 10 is removed by ashing. The dummy grooves 10 and wiring grooves 12 are thus formed.

As described above, in the first embodiment the dummy grooves 10 are first formed and the dummy grooves 10 are buried with burying material, and thereafter the wiring grooves 12 are formed and then the burying material is removed. As a modification of the first embodiment, wiring grooves 12 may be formed first, and the wiring grooves 12 are buried with burying material, and thereafter dummy grooves 10 are formed and the burying material may be removed threreafter. Since the grooves of the first embodiment to be buried with the burying material are shallower than those of the modification, it becomes easy to remove the burying material.

Figure 1H:
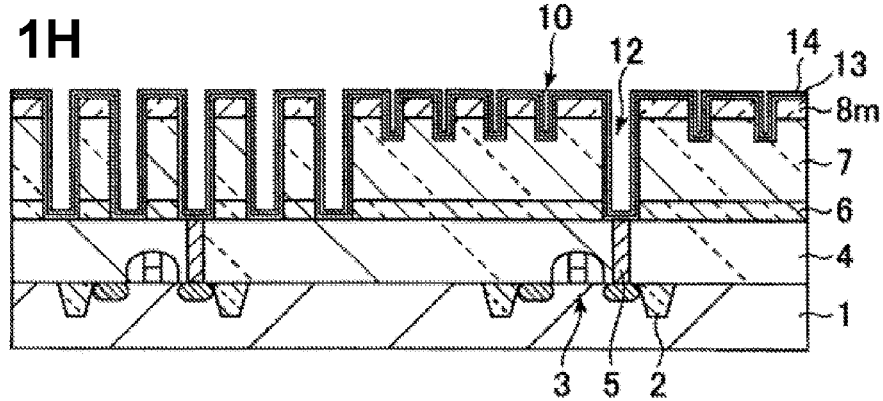

Reference is made to FIG. 1H, for example, tantalum nitride (TaN) is deposited on the hard mask 8m to a thickness of 1 nm to 30 nm by PVD (e.g., by sputtering), covering the inner surfaces of the dummy grooves 10 and wiring grooves 12 to form a conductive film 13 as a barrier metal film. The barrier metal film suppresses wiring material copper (Cu) to be formed on the barrier metal film from diffusing into the interlayer insulating film 7. The deposition conditions of the conductive film 13 are, e.g., to flow N$_2$ gas and Ar gas at a flow ratio of N$_2$:Ar=20:80 and to supply electric power of 1 kW to 40 kW by using a Ta target to react Ta and N$_2$ gas.

As the conductive film 13, one or a plurality of metals or their nitride may be used being selected from a group consisting of titanium (Ti), nickel (Ni), cobalt (Co), zirconium (Zr), chrome (Cr), palladium (Pd), manganese (Mn), silver (Ag), aluminum (Al), tin (Sn), tantalum (Ta), rhenium (Re), tungsten (W), platinum (Pt), vanadium (V), ruthenium (Ru), gold (Au). The conductive film 13 may be formed not only by PVD, but also by one of, or a combination of CVD, PE-CVD, atomic layer deposition (ALD), plasma enhanced ALD (PE-ALD).

The conductive film 13 may be formed under the conditions that the conductive film 13 is grown at the same time when at least a portion of the conductive film 13 is etched, like high density plasma CVD. Attachment to the side wall is therefore improved.

For example, Cu is deposited on the conductive film 13 to a thickness of 1 nm to 100 nm by PVD (e.g., sputtering) to form a seed film 14. The deposition conditions of the seed film 14 are, e.g., supply of an electric power of 1 kW to 40 kW by using a Cu target in an Ar gas atmosphere. The seed film 14 may be formed not only by PVD, but also by CVD, PE-CVD, ALDS, and PE-ALD. One or two or more elements may be mixed into the seed film 14, being selected from a group consisting of Ti, Ni, Co, Zr, Cr, Pd, Mn, Ag, Al, Sn, Ta, Re, W, Pt, V, Ru, Au, Si, Ge, C, S, O, Cl, P, B, H, Hf, F, and N.

Figure 1I:
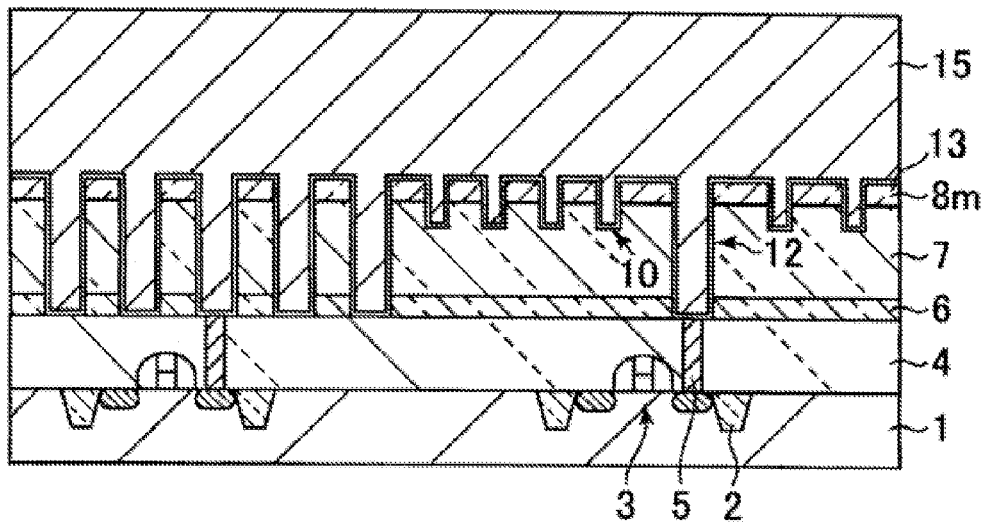
Figure 1J:
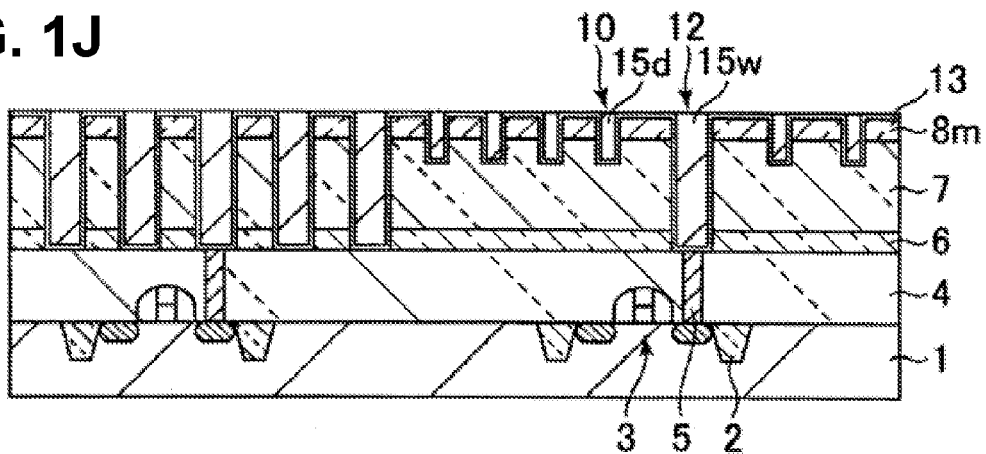

Reference is made to FIG. 1I. Wiring material Cu is precipitated on the seed film 14 by electrolytic plating using the seed film 14 as a feeder portion to form a plated film 15 and bury the dummy grooves 10 and wiring grooves 12. The seed film 14 is omitted in FIG. 1I and following drawings. A thickness of the plated film 15 is set thicker than a thickness of the interlayer insulating film 7, e.g., 1.2 micrometers. The dummy grooves 10 and wiring grooves 12 are buried with the conductive material Cu and Cu is deposited also on the upper surface of the hard mask 8m to a predetermined thickness. One or two or more elements may be mixed into the wiring material Cu, being selected from a group consisting of Ti, Ni, Co, Zr, Cr, Pd, Mn, Ag, Al, Sn, Ta, Re, W, Pt, V, Ru, Au, Si, Ge, C, S, O, Cl, P, B, H, Hf, F, and N. Instead of the plated conductive layer 15, a conductive layer 15 deposited by CVD, PE-CVD, ALD, or PE-ALD may be used.

Reference is made to FIG. 1lJ. A first polishing process is performed to remove the plated film 15 and the seed film 14 above the hard mask 8m by CMP. The polishing method may be, e.g., a rotary polishing method. The polishing conditions are, e.g., a revolution number of 70 rpm of a work table, a revolution number of 71 rpm of a polishing head. A polishing pressure is, e.g., $1.4000 \times 10^4$ Pa (2.0 psi).

Polishing is performed by supplying polishing slurry to a polishing pad having polyurethane as a base material bonded to a work table. Polishing slurry has preferably a higher polishing rate of the plated film 15 and seed film 14 than a polishing rate of the conductive film 13 and interlayer insulating film 7.

The polishing slurry is used having the constituent components of, e.g., colloidal silica abrasive grains containing chemicals such as dispersant, oxidant, anticorrosive, and chelate. Abrasive grains are used containing one of colloidal silica, fumed silica, cerium, alumina, and silicon carbide. The oxidant may be, e.g., ammonium persulfate, or hydrogen peroxide. The anticorrosive may be, e.g., benzotriazole (BTA). The chelate may be, e.g., citric acid, malic acid, quinaldinic acid, oleic acid and the like. The polishing slurry suitable for polishing may be HS-H635 (product name) and HS-C930 (product name) of Hitachi Chemical, CMS74 series and CMS75 series of JSR Company, and the like.

When the conductive film 13 on the hard mask 8m is exposed, the first polishing process is terminated. With the first polishing process, the plated dummy wirings 15d in the dummy grooves 10 and the plated real wirings 15w in the wiring grooves 12 are separated. The real wirings are simply called wirings.

Figure 1K:
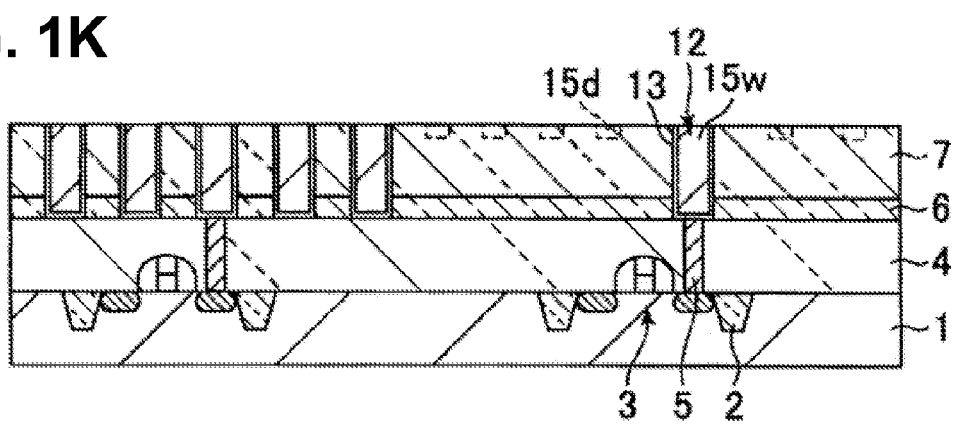

Reference is made to FIG. 1K. A second polishing process is performed to remove the conductive film 13 on the hard mask 8m, the hard mask 8m and the upper portion of the interlayer insulating film 7 by CMP. It is desired that the polishing slurry to be used by the second polishing process has a higher polishing rage of the conductive film 13 than a polishing rate of the interlayer insulating film 7.

The polishing slurry to be adopted is, e.g., a polishing slurry capable of polishing the conductive film 13, dummy wirings 15d, wirings 15w and hard mask 8m at a similar polishing rate and polishing the interlayer insulating film 7 at a lower polishing rate. Polishing abrasive liquid suitable for this polishing may be, e.g., acid liquid of T605-8 (product name) of Hitachi Chemical, and alkaline liquid of CMS8201/8252 (product name), CMS8501/8552 (product name) of JSR Company, and the like.

As the conductive film 13 on the upper surface of the hard mask 8m is removed after the second polishing process starts, the dummy wirings 15d and wirings 15w are electrically separated. As the hard mask 8m is removed, the upper surface of the interlayer insulating film 7 is exposed.

A portion of the interlayer insulating film 7 (and dummy wirings 15d and wirings 15w) are polished to terminate the second polishing process. A polishing amount of the interlayer insulating film 7 is set to, e.g., 20 nm to 100 nm. With the wiring forming method of the first embodiment, as a portion of the interlayer insulating film 7 is polished, the dummy wirings 15d are also polished and removed. The wirings 15w and barrier metal films 13 are left in the wiring grooves 12. Wirings of the single damascene method of the first embodiment are formed in this manner.

Since the dummy wirings 15d are disposed, a copper material distribution (Cu occupancy factor) in the interlayer insulating film 7 is averaged in the wafer plane more than without dummy wirings. Polishing rates in the wafer plane are therefore uniformized so that erosion and the like are suppressed. Disposing dummy wirings during polishing is therefore effective.

The smaller the dummy wirings 15d left on the wiring structure, the better in order to suppress a wiring delay after polishing. In the first embodiment, as a depth of the dummy grooves 10 formed in the interlayer insulating film 7 is set equal to or shallower than a polishing amount of the interlayer insulating film 7, the dummy wirings 15d are removed by polishing.

A portion of the dummy wirings 15d may be left in the interlayer insulating film 7 after polishing. The left dummy wirings 15d are indicated by broken lines in FIG. 1K. Even in this case, since a volume of the left dummy wirings 15d is small, the influence upon a wiring delay is small. The dummy wirings 15d left in the wiring structure after polishing are not connected to the wirings 15w in the same layer and wirings in the lower and upper layers, and in an electrically independent floating state.

With reference to FIGS. 2A to 2D, description will be made on an example of a plan layout of wirings and dummy wirings. Each of FIGS. 2A to 2D is a schematic plan view illustrating a plan layout of wirings and dummy wirings, the lower portions being schematic cross sectional views illustrating wirings and dummy wirings. FIGS. 2A to 2D illustrate variations of a plan layout of dummy wirings. In each of FIGS. 2A to 2D, the left side is a layout area for wirings wi, and dummy wirings du are disposed in the right area of the layout area of the wirings wi, to average the Cu occupancy rates in the in-plane more than without dummy wirings du.

Figure 2A:
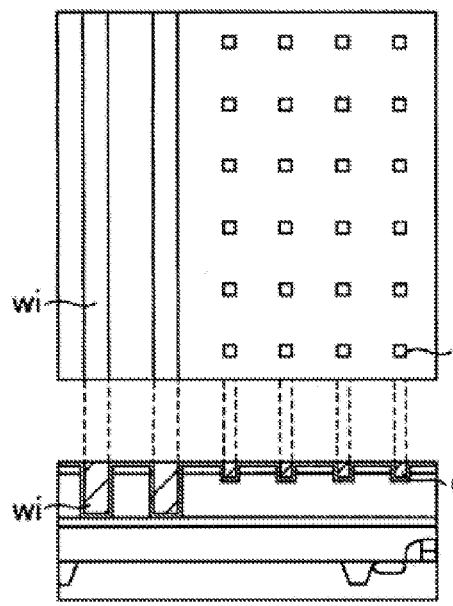
FIGS. 2A to 2D are schematic plan views illustrating a plan layout of wirings and dummy wirings and schematic cross sectional views illustrating wirings and dummy wirings.

In FIG. 2A, dummy wirings du of a square shape are disposed in a square matrix shape. A plan shape of the dummy wiring du is not limited to a square, but may be a rectangle or the like. The layout is not limited to a square matrix shape. It is proper that the size of each dummy wiring du has, a side of about 0.1 micron to 1.0 micron. A Cu occupancy factor in the dummy wiring layout area is preferably 20% to 40%.

Figure 2B:
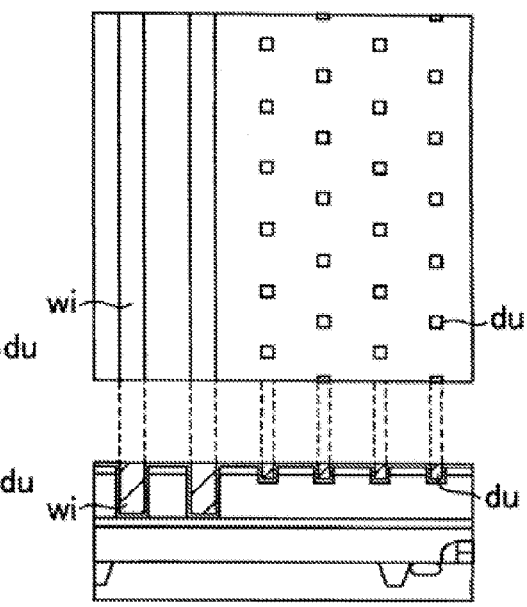

In FIG. 2B, square dummy wirings du are disposed in a zigzag shape.

Figure 2C:
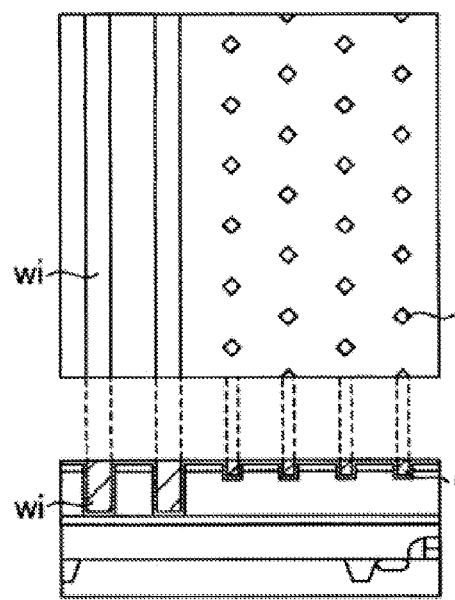

In FIG. 2C, rhomboid dummy wirings du are disposed in a zigzag shape.

Figure 2D:
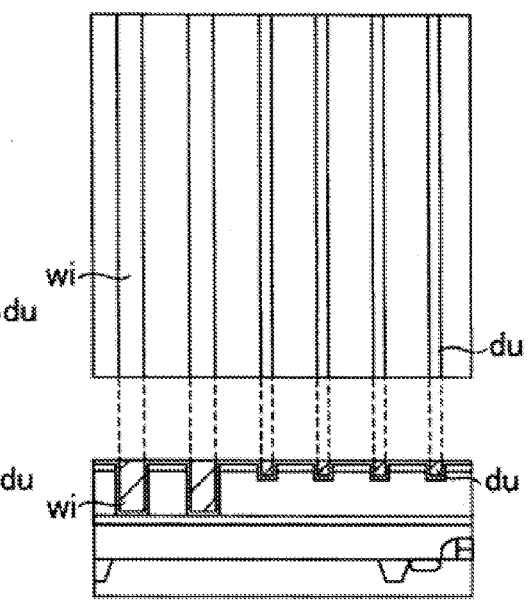

In FIG. 2D, stripe dummy wirings du are disposed parallel to wirings wi.

Next, description will be made on a dual damascene wiring forming method of the second embodiment.

FIGS. 3A to 3K are schematic cross sectional views illustrating main processes of the wiring forming method of the second embodiment.

Figure 3A:
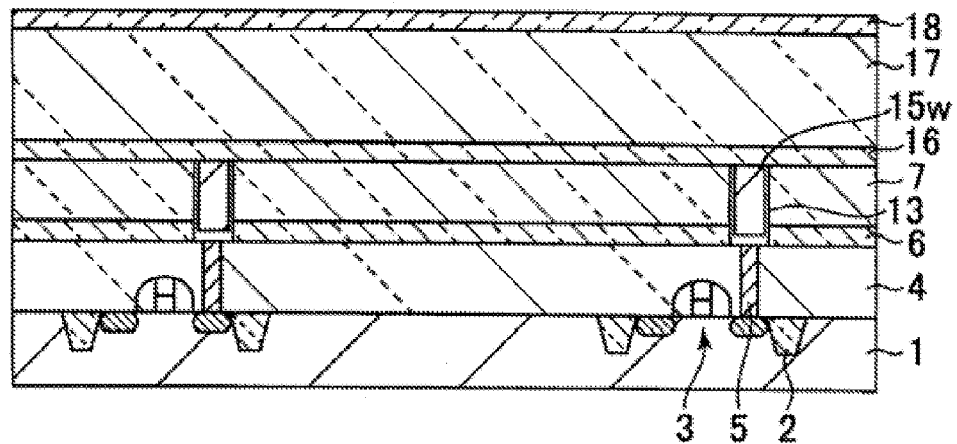
FIGS. 3A to 3K are schematic cross sectional views illustrating main processes of a wiring forming method according to a second embodiment.

Reference is made to FIG. 3A. First, in a manner similar to the first embodiment, processes up to a process of forming wirings 15w in the interlayer insulating film 7 by single damascene are performed. An etching stopper film 16 is formed on the interlayer insulating film 7 in a manner similar to the method of forming the etching stopper film 6 described in the first embodiment. An interlayer insulating film 17 is formed on the etching stopper film 16 in a manner similar to the method of forming the interlayer insulating film 7 described in the first embodiment. A hard mask film 18 is formed on the interlayer insulating film 17 in a manner similar to the method of forming the hard mask film 8 described in the first embodiment.

Figure 3B:
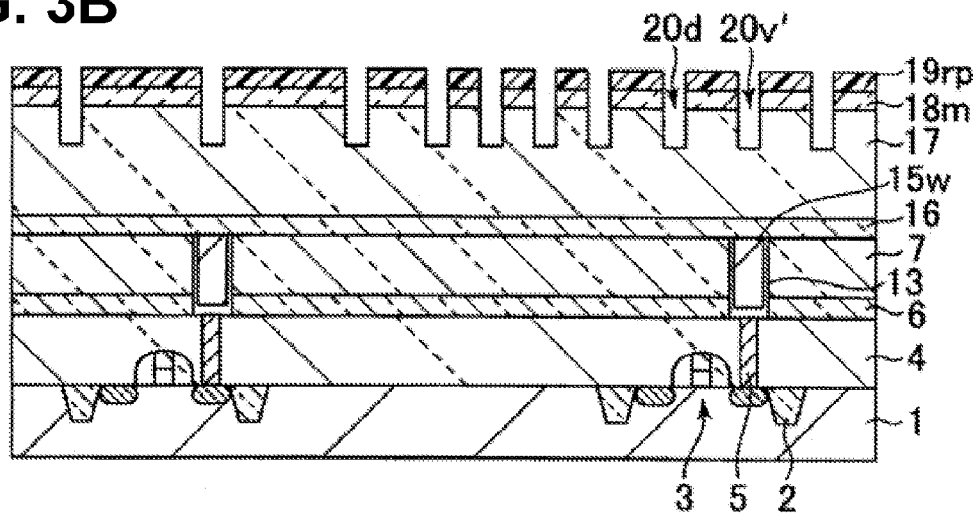

Reference is made to FIG. 3B. Photoresist is coated on the hard mask film 18, exposed and developed to form a resist pattern 19rp having openings of a shape corresponding to dummy grooves 20d and grooves 20v' where via holes are to be formed.

By using the resist pattern 19rp as a mask, the hard mask film 18 is etched by RIE to form a hard mask 18m. By using the resist pattern 19rp and hard mask 18m as a mask, the interlayer insulating film 17 is etched by RIE to form dummy grooves 20d and grooves 20v' in the interlayer insulating film 17.

In the second embodiment, the dummy grooves 20d and grooves 20v' are formed by the same process and have the same depth. The grooves 20v' are made deeper by a wiring groove etching process to be described later to form via holes 20v to be connected to wirings 15w in an underlying layer.

Figure 3C:
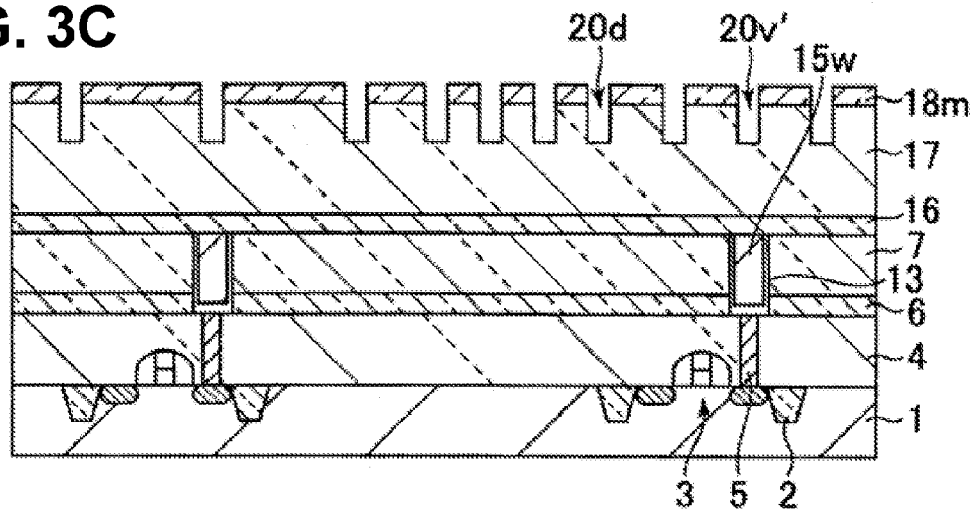

Reference is made to FIG. 3C. The resist pattern 19rp is removed by ashing.

Figure 3D:
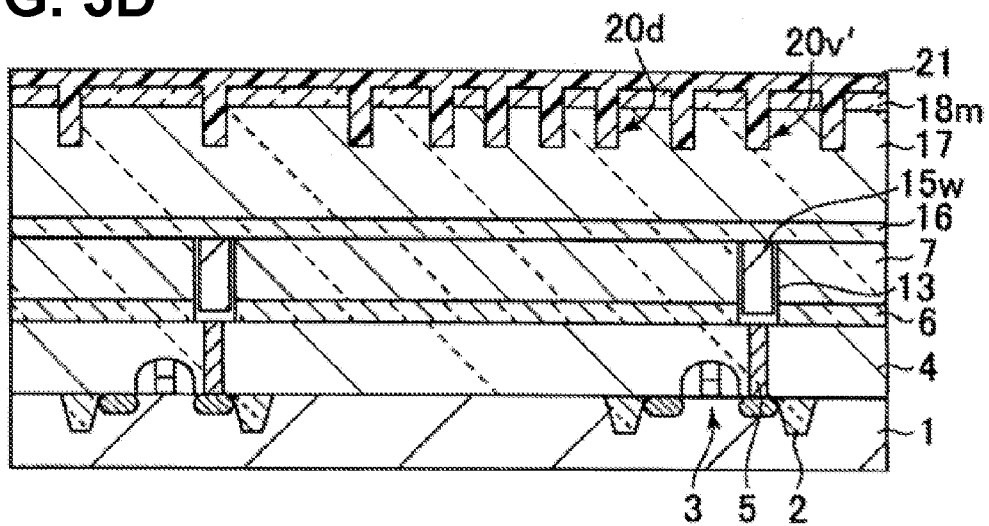

Reference is made to FIG. 3D. Photoresist is coated on the hard mask 18m to form a resist film 21. The resist film 21 buries the dummy grooves 20d and grooves 20v'.

Figure 3E:
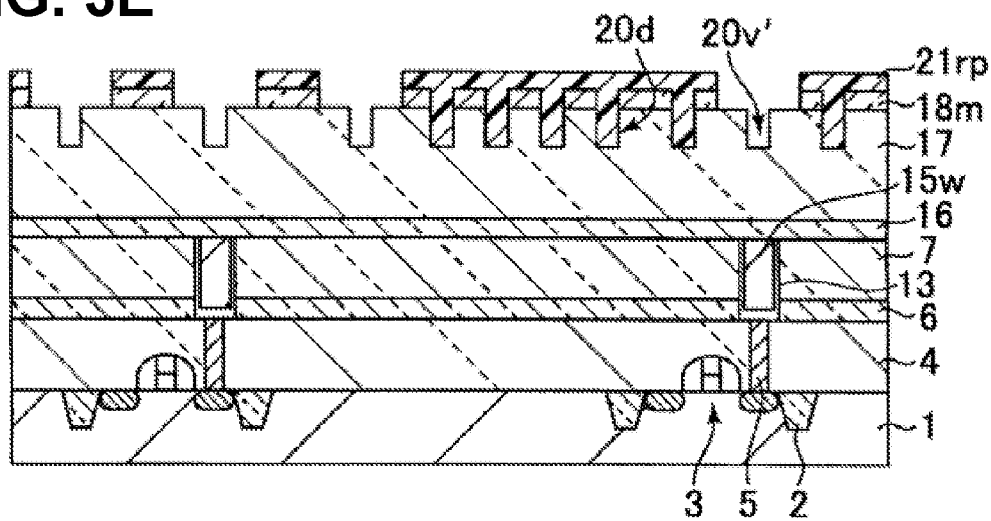

Reference is made to FIG. 3E. The resist film 21 is exposed and developed to form a resist pattern 21rp having openings of a shape corresponding to wiring grooves. By using the resist pattern 21rp as a mask, the hard mask 18m is etched by RIE to form openings of a shape corresponding to wiring grooves in the hard mask 18m. Grooves 20v' are disposed on the bottoms of the wiring grooves.

Figure 3F:
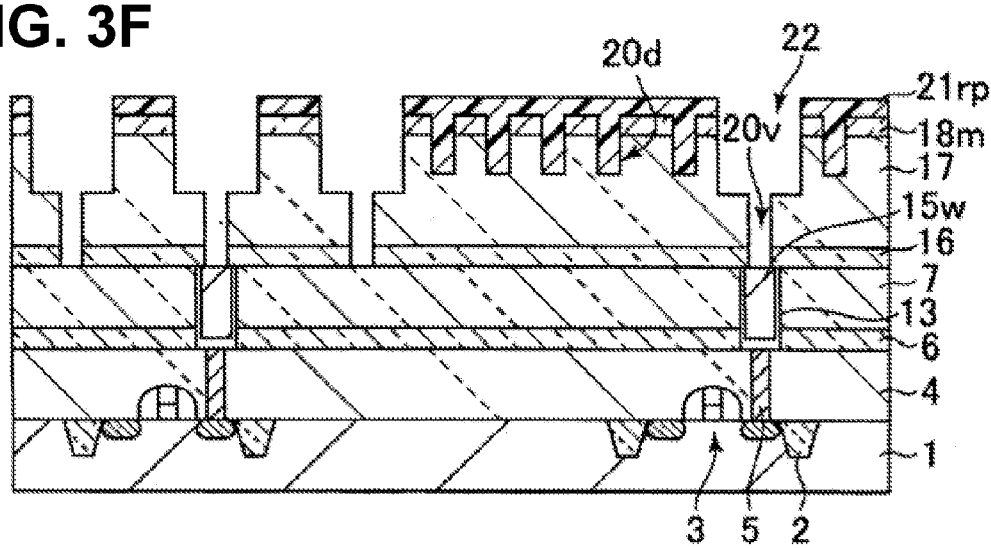

Reference is made to FIG. 3F. By using the resist pattern 21rp and hard mask 18m as a mask, the interlayer insulating film 17 is etched by RIE to form wiring grooves 22 through the interlayer insulating film 17. As the wiring grooves 22 are formed, the grooves 20v' are etched further to form via holes 20v. As the bottom of the via hole 20v reaches the etching stopper film 16, the etching gas is changed to etch the etching stopper film.

Figure 3G:
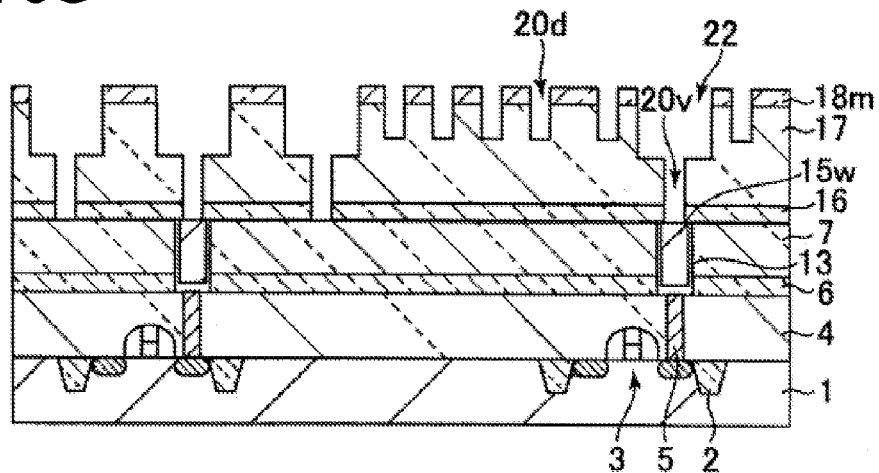

Reference is made to FIG. 3G. The resist pattern 21rp burying the dummy grooves 20d is removed by ashing. The dummy grooves 20d, via holes 20v and wiring grooves 22 are formed in the manner described above.

Figure 3H:
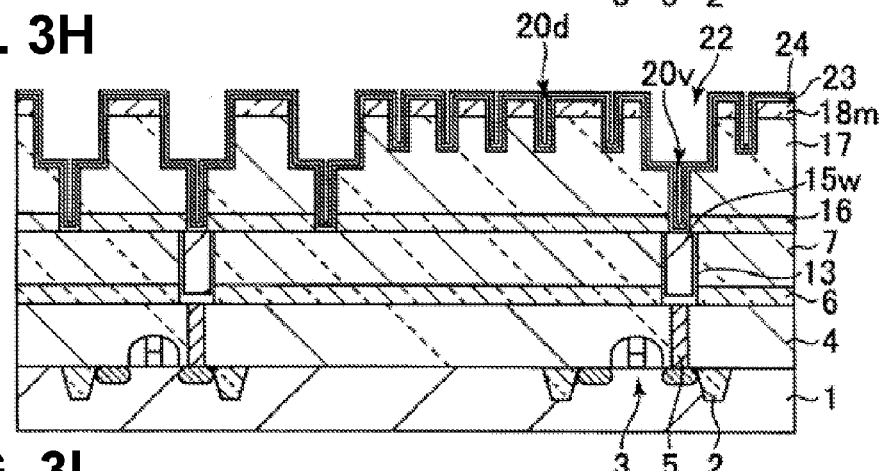

Reference is made to FIG. 3H. A conductive film 23 as a barrier metal film is formed on the hard mask 18m, covering the inner surfaces of the dummy grooves 20d, via holes 20v and wiring grooves 22, in the manner similar to the method of forming the conductive film 13 described in the first embodiment. A seed film 24 is formed on the conductive film 23 in the manner similar to the method of forming the seed film 14 described in the first embodiment.

Figure 3I:
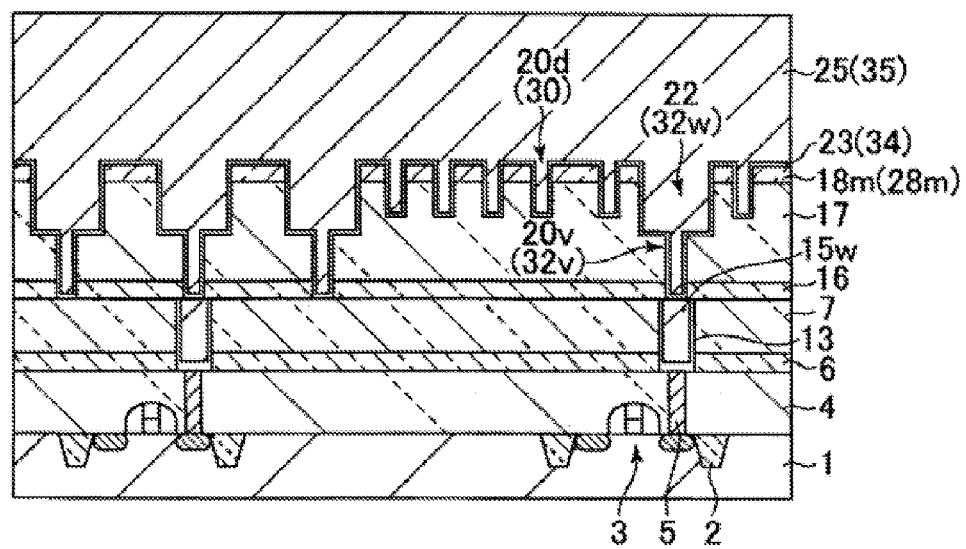

Reference is made to FIG. 3I. A plated film 25 is formed on the seed film 24 by using conductive material, e.g., Cu, in the manner similar to the method of forming the plated film 15 described in the first embodiment, to bury the dummy grooves 20d, via holes 20v and wiring grooves 22. The conductive material is buried in the dummy grooves 20d, via holes 20v and wiring grooves 22, and deposited also on the hard mask 18m.

Figure 3J:
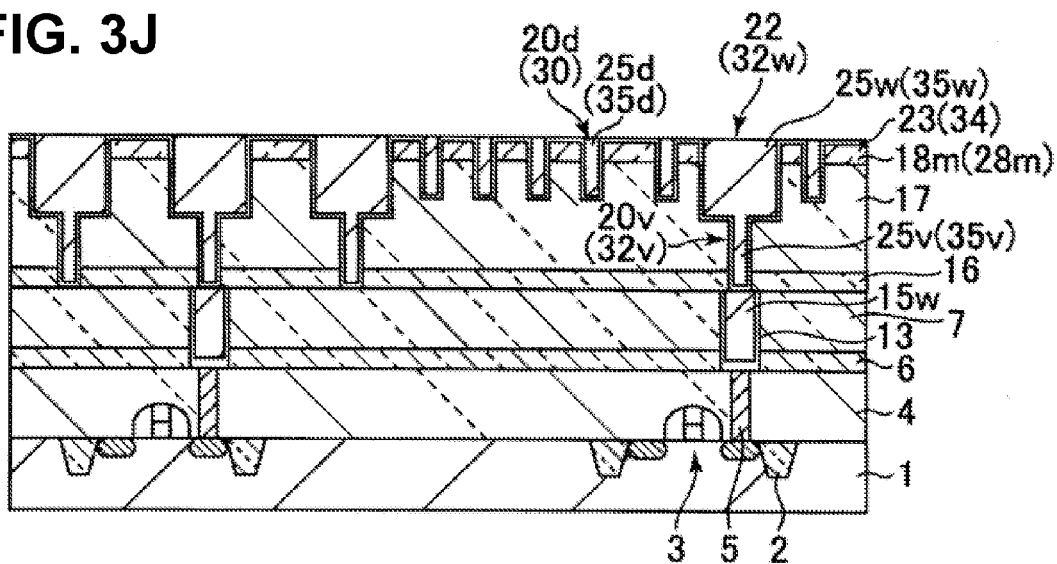

Reference is made to FIG. 3J. The plated film 25 above the hard mask 18m and the seed film 24 are removed by CMP in the manner similar to the first polishing process described in the first embodiment to expose the conductive film 23 on the hard mask 18m.

Figure 3K:
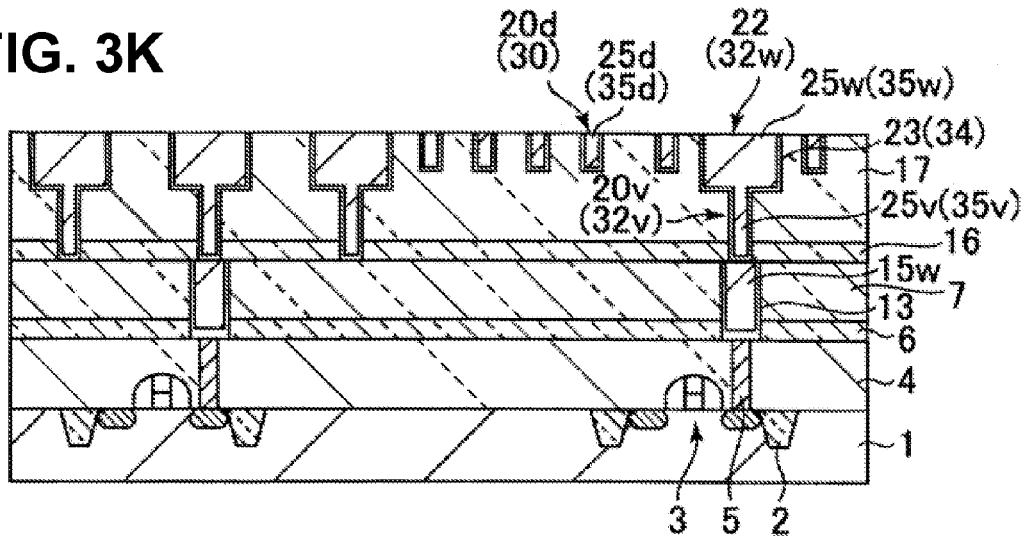

Reference is made to FIG. 3K. The conductive film 23 on the hard mask 18m, the hard mask 18m and an upper portion of the interlayer insulating film 17 are removed by CMP in the manner similar to the second polishing process described in the first embodiment. The interlayer insulating film 17, dummy wirings 25d and wirings 25w are polished to form vias 25v in the via holes 20v and wirings 25w in the wiring grooves 22. The barrier metal film 23 is sandwiched between the interlayer insulating film 17 and the conductor including the via 25v and wiring 25w. The dual damascene wirings of the second embodiment are formed in the manner described above. The dummy wirings 25d are formed shallower than the wirings 25w.

Next, description will be made on a dual damascene wiring forming method of the third embodiment different from the second embodiment. In the second embodiment, the dummy grooves 20d and the grooves 20v' corresponding to the via holes were formed at the same time as illustrated in FIG. 3C. In the third embodiment, the dummy grooves, via holes and wiring grooves are formed by independent processes. It is therefore possible to form the dummy grooves to a desired depth shallower than the wiring grooves. FIGS. 4A to 4I are schematic cross sectional views illustrating main processes of the wiring forming method of the third embodiment.

Figure 4A:
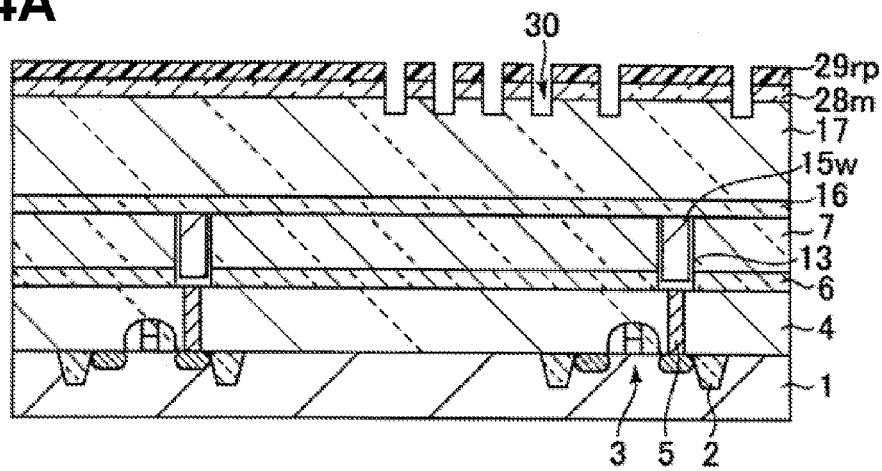
FIGS. 4A to 4I are schematic cross sectional views illustrating main processes of a wiring forming method according to a third embodiment.

Reference is made to FIG. 4A. Constituent elements up to the interlayer insulating film 17 are formed in the manner similar to the second embodiment. A hard mask film is formed on the interlayer insulating film 17 in the manner similar to the method of forming the hard mask film 18 described in the second embodiment. Photoresist is coated on the hard mask film, exposed and developed to form a resist pattern 29rp having openings of a shape corresponding to dummy grooves 30.

By using the resist pattern 29rp as a mask, the hard mask film is etched by RIE to form a hard mask 28m. By using the resist pattern 29rp and hard mask 28m as a mask, the interlayer insulating film 17 is etched by RIE to form dummy grooves 30 in the interlayer insulating film 17.

Figure 4B:
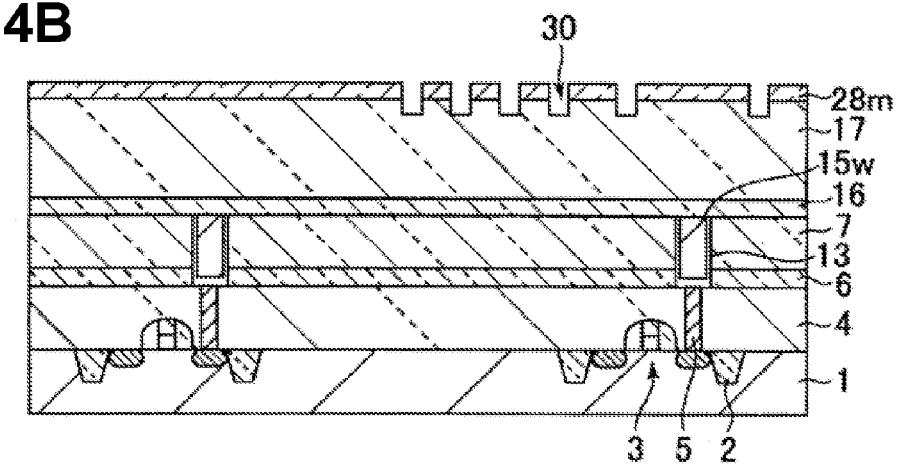

Reference is made to FIG. 4B. The resist pattern 29rp is removed by ashing.

Figure 4C:
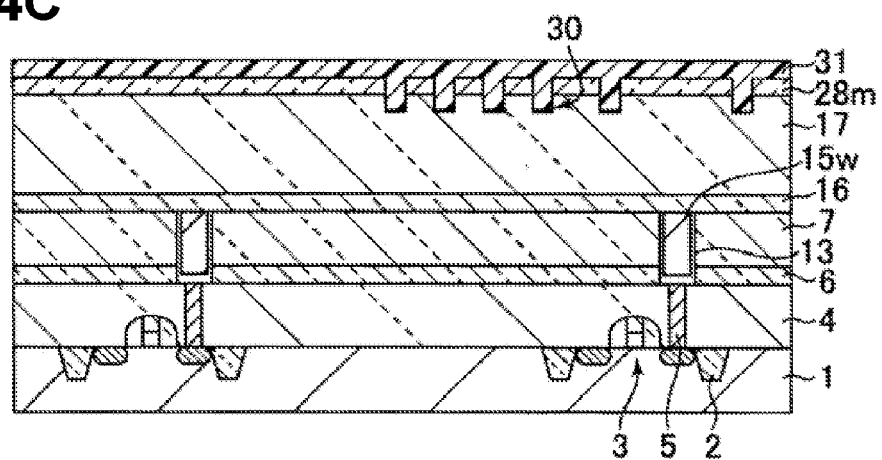

Reference is made to FIG. 4C. Photoresist is coated on the hard mask 28m to form a resist film 31. The resist film 31 buries the dummy grooves 30.

Figure 4D:
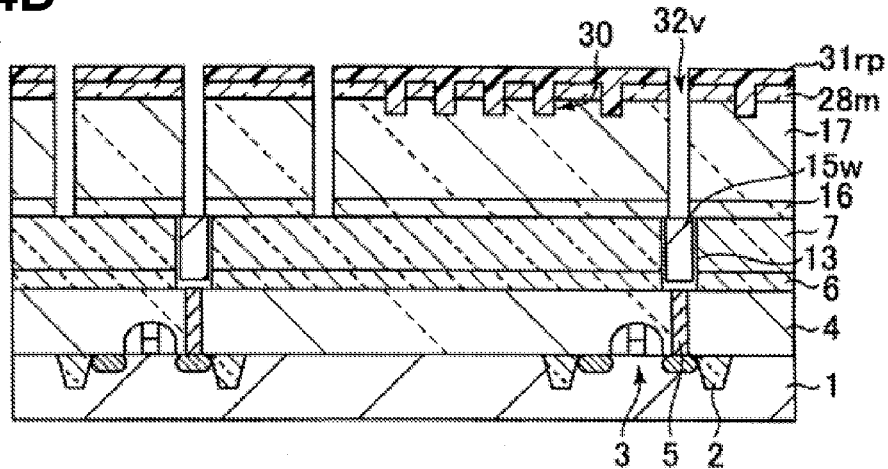

Reference is made to FIG. 4D. The resist film 31 is exposed and developed to form a resist pattern 31rp having openings of a shape corresponding to via holes 32v. By using the resist pattern 31rp as a mask, the hard mask 28m is etched by RIE to form openings of a shape corresponding to the via holes 32v.

By using the resist pattern 31rp and hard mask 28m as a mask, the interlayer insulating film 17 is etched by RIE to form via holes 32v through the interlayer insulating film 17. When the bottom of the via hole 32v reaches the etching stopper film 16, the etching gas is changed to etch the etching stopper film 16 to expose wirings 15w in the lower layer.

Figure 4E:
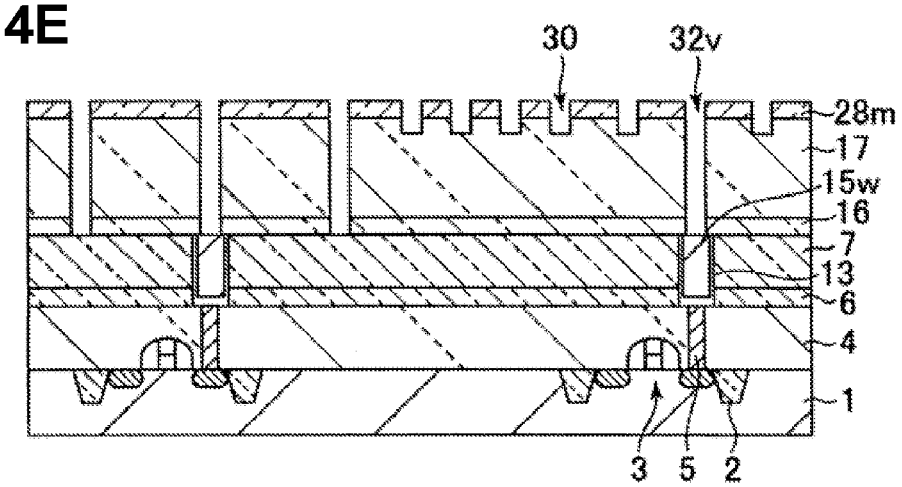

Reference is made to FIG. 4E. The resist pattern 31rp burying the dummy grooves is removed by ashing.

Figure 4F:
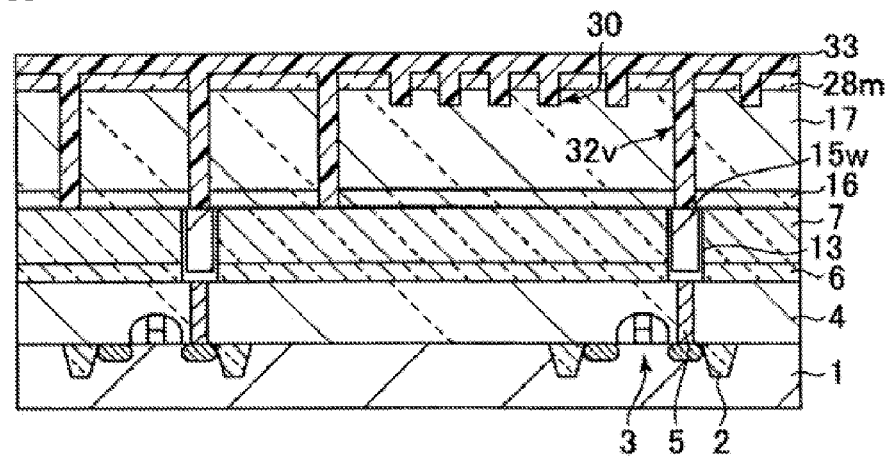

Reference is made to FIG. 4F. Photoresist is coated on the hard mask 28m to form a resist film 33. The resist film 33 buries the dummy grooves 30 and via holes 32v.

Figure 4G:
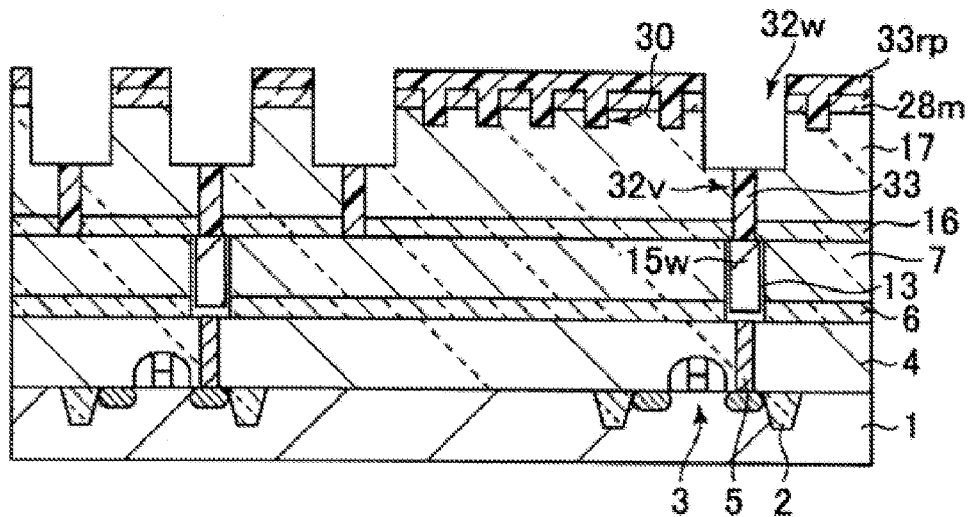

Reference is made to FIG. 4G. The resist film 33 is exposed and developed to form a resist pattern 33rp having openings of a shape corresponding to wiring grooves 32w. By using the resist pattern 33rp as a mask, the hard mask 28m is etched by RIE to form openings of a shape corresponding to the wiring grooves 32w. By using the resist pattern 33rp and hard mask 28m as a mask, the interlayer insulating film 17 is etched by RIE to form wiring grooves 32w in the interlayer insulating film 17. The resist film 33 as the burying material is left in the via holes 32v under the bottoms of the wiring grooves 32w.

Figure 4H:
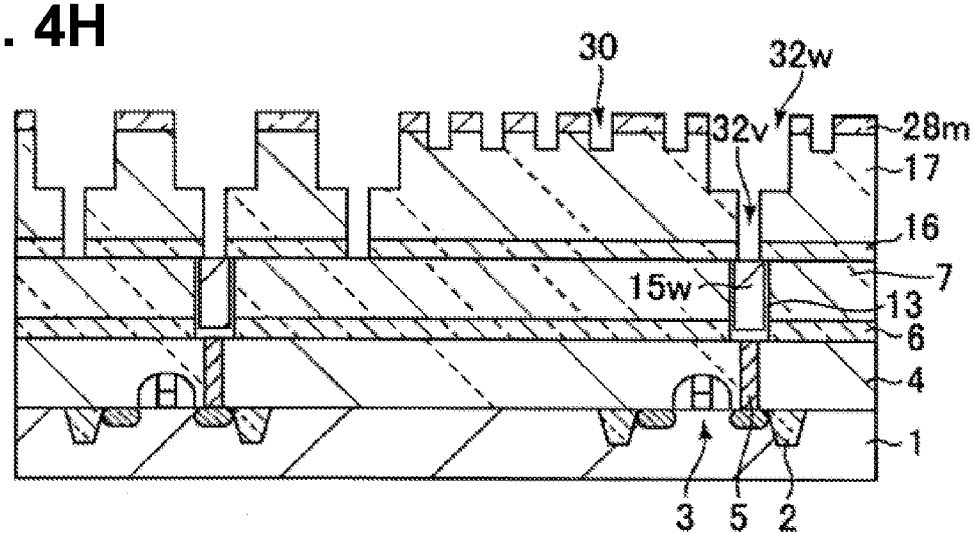

Reference is made to FIG. 4H. The resist pattern 33rp burying the dummy grooves 30 and the resist films 33 left in the via holes 32v are removed by ashing. The dummy grooves 30, via holes 32v and wiring grooves 32W of the third embodiment are formed in the manner described above.

Similar to the second embodiment, a conductive film 34 as the barrier metal film is thereafter formed on the hard mask 28m, covering the inner surfaces of the dummy grooves 30, via holes 32v and wiring grooves 32w, a Cu seed film is formed on the conductive film 34, and Cu is deposited on the Cu seed film by a plating method to form a plated film 35 (Refer to FIG. 3I).

Further, similar to the second embodiment, the plated film 35 on the hard mask 28m and the seed film are removed by CMP (Refer to FIG. 3J).

Figure 4I:
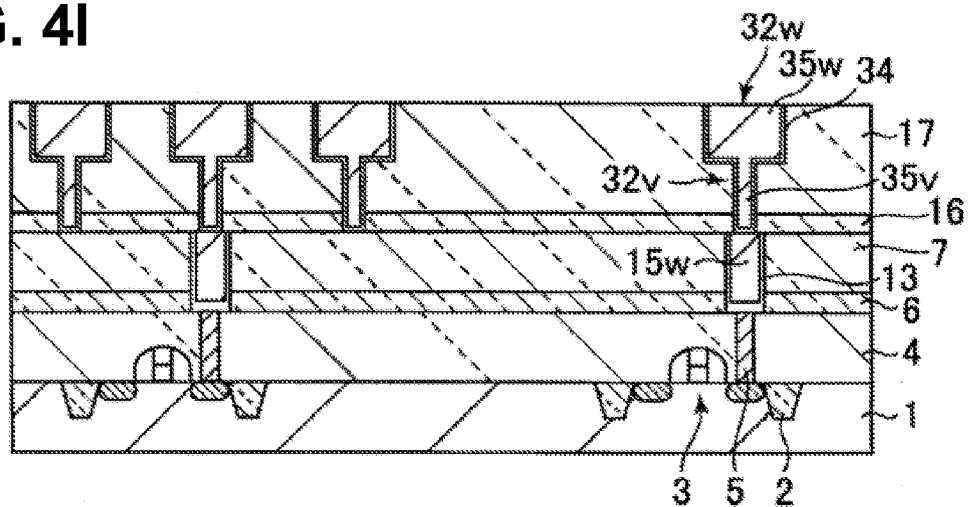

Reference is made to FIG. 4I, further, similar to the second embodiment, the conductive film 34 on the hard mask 28m, the hard mask 28m and an upper portion of the interlayer insulating film 17 are removed by CMP. Vias 35v in the via holes 32v and wirings 35w in the wiring grooves 32W are therefore formed. The barrier metal film 34 is sandwiched between the interlayer insulating film 17 and the conductor including the via 35v and wiring 35w. The dual damascene wirings of the third embodiment are formed in the manner described above.

In the third embodiment, as illustrated in FIGS. 4B and 4D, it is possible to independently form the dummy grooves 30v and via holes 32v. FIG. 4I illustrates an example wherein all dummy wirings are removed. Also in the third embodiment, a portion of the dummy wirings 35d may be left in the interlayer insulating film 17 (Refer to FIG. 3K). Also in this case, since a volume of the left dummy wirings 35d is small, the influence upon a wiring delay is small.

In the third embodiment, the dummy grooves were formed first, and then the via holes 32v and wiring grooves 32w were formed. As a modification of the third embodiment, the via holes 32v and wiring grooves 32w may be formed first, and then the dummy grooves 30 may be formed.

In the third embodiment, although the via holes 32v were formed first, and then wiring grooves 32w were formed, the wiring grooves 32w may be formed first, and then the via holes 32v may be formed. In the above modification of the third embodiment, the via holes 32v may be formed first, and then the wiring grooves 32w may be formed, or the wiring grooves 32w may be formed first, and then the via holes 32v may be formed.

As a process sequence modification example, a process of forming the dummy grooves may be executed between a process of forming the via holes 32v and a process of forming the wiring grooves 32w or between a process of forming the wiring grooves 32W and a process of forming the via holes 32v.

In the third embodiment, the dummy grooves 30 are buried by the process illustrated in FIG. 4C before the via holes 32v are formed and by the process illustrated in FIG. 4F before the wiring grooves 32w are formed. The recess formed first is buried the largest number of times and has the largest number of processes of removing the burying material. From the viewpoint of facilitating to remove the burying material, the shallowest dummy grooves 30 are preferably formed first. If wide and deep wiring grooves are to be buried, the amount of the burying material becomes largest and the burying material becomes hard to be removed. In order not to bury the wiring grooves 32w, the wiring grooves 32w are preferably formed last.

Also in forming dual damascene wirings of the second and third embodiments, similar to forming single damascene wirings of the first embodiment, the dummy wirings 25d and 35d uniformize the polishing rates in the in-plane of the interlayer insulating film 17 having a low dielectric constant, and erosion and the like are suppressed. Since the dummy wirings 25d and 35d are formed shallower than at least the wirings 25w and 35w, a volume of dummy wirings left after polishing is able to be made small and a wiring delay to be caused by the dummy wirings is suppressed. The flexibility of dummy wiring layout is improved.

Even if the dummy wirings 25d and 35d of dual damascene of the second and third embodiments are left on the wiring structure after polishing, the dummy wirings are not connected to the wirings 25w and 35w of the same layer and the wirings of the lower and upper layers, and are in an electrically independent floating state, similar to the dummy wirings of single damascene of the first embodiment.

As described in the first to third embodiments and corresponding modifications, erosion and the like are able to be suppressed and a wiring delay to be caused by left dummy wirings is able to be suppressed, by forming dummy wirings shallower than at least single or dual damascene wirings. The dummy grooves are shallower than the wiring grooves. A volume of the conductive material in the dummy grooves is easy to be made small.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device manufacture method comprising:
    forming an insulating film above a semiconductor substrate;
    forming a dummy groove having a first depth in said insulating film;
    forming a first resist pattern in said dummy groove;
    with said first resist pattern being in the dummy groove, forming a wiring groove and a via hole in said insulating film, said wiring groove having a second depth deeper than said first depth, and said via hole being disposed on a bottom of said wiring groove;
    removing said first resist pattern from said dummy groove;
    depositing a conductive material in said dummy groove, said wiring groove and said via hole and above said insulating film; and
    polishing and removing said conductive material above said insulating film.

2. The semiconductor device manufacture method according to claim 1,
    wherein:
    in said forming said dummy groove, a groove is formed in the insulation film, said groove being disposed at a position where said via hole is formed;
    in said forming said first resist pattern, a second resist pattern is formed on the insulating film, said second resist pattern exposing said groove; and
    in said forming said wiring groove and said via hole, said insulating film is etched by using said second resist pattern as a mask to form said wiring groove and said via hole.

3. The semiconductor device manufacture method according to claim 1, wherein in said forming said dummy groove and in said forming said wiring groove and said via hole, etching said insulating film to form said dummy groove, said wiring groove and said via hole is performed by using a hard mask using a common film.

4. The semiconductor device manufacture method according to claim 1, further comprising: polishing and removing an upper portion of said insulating film after polishing and removing said conductive material above said insulating film.

5. The semiconductor device manufacture method according to claim 4, wherein in said polishing and removing an upper portion of said insulating film, said conductive material in said dummy groove is removed.

6. The semiconductor device manufacture method according to claim 5, wherein in said polishing and removing an upper portion of said insulating film, said conductive material in said dummy groove is not totally removed and partially left, said left conductive material in said dummy groove is in an electrically independent floating state, and said conductive material in said wiring groove is electrically connected to a wiring in a lower layer.

7. The semiconductor device manufacture method according to claim 4, wherein in said polishing and removing an upper portion of said insulating film, a depth of polishing and removing said insulating film is equal to a depth of said dummy groove.

8. The semiconductor device manufacture method according to claim 1, wherein in said forming said insulating film, said insulating film containing organic material and having a low dielectric constant of 3.0 or lower.

9. The semiconductor device manufacture method according to claim 8, wherein in said forming said insulating film, said insulating film is formed by one of, or a combination of, CVD, plasma enhanced CVD and spin coating, by using a material selected from a group consisting of organic silane having methyl group and organic siloxane having methyl group.

10. The semiconductor device manufacture method according to claim 1, wherein in said depositing said conductive material, a conductive material containing copper is deposited.

11. The semiconductor device manufacture method according to claim 4, wherein in said polishing and removing an upper portion of said insulating film, an upper portion of said insulating film is polished and removed by chemical mechanical polishing.

12. A semiconductor device manufacture method comprising:
    forming an insulating film above a semiconductor substrate;
    forming a dummy groove having a first depth in said insulating film;
    forming a first resist pattern in said dummy groove;
    with said first resist pattern being in the dummy groove, forming a wiring groove having a second depth deeper than said first depth in said insulating film;
    removing said first resist pattern from said dummy groove;
    depositing a conductive material in said dummy groove, said wiring groove and above said insulating film; and
    polishing and removing said conductive material above said insulating film.

13. The semiconductor device manufacture method according to claim 12, wherein:
    in said forming said first resist pattern, a second resist pattern is formed on the insulating film, said second resist pattern having an opening above said wiring groove; and
    in said forming said wiring groove, said insulating film is etched by using said second resist pattern as a mask to form said wiring groove.

14. The semiconductor device manufacture method according to claim 12, wherein: in said forming said dummy groove and said wiring groove, etching said insulating film to form said dummy groove and said wiring groove is performed by using a hard mask using a common film.

15. The semiconductor device manufacture method according to claim 12, further comprising: polishing and removing an upper portion of said insulating film after said polishing and removing said conductive material above said insulating film.

16. The semiconductor device manufacture method according to claim 15, wherein: in said polishing and removing an upper portion of said insulating film said conductive material in said dummy groove is removed.

17. The semiconductor device manufacture method according to claim 16, wherein in said polishing and removing an upper portion of said insulating film, said conductive material in said dummy groove is not totally removed but partially left, said left conductive material in said dummy groove is in an electrically independent floating state, and said conductive material in said wiring groove is electrically connected to a wiring in a lower layer.

* * * * *